(12) United States Patent
Suzuki

(10) Patent No.: US 6,812,759 B2
(45) Date of Patent: Nov. 2, 2004

(54) DLL CIRCUIT CAPABLE OF PREVENTING LOCKING IN AN ANTIPHASE STATE

(75) Inventor: Misao Suzuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/425,320

(22) Filed: Apr. 29, 2003

(65) Prior Publication Data

US 2003/0201812 A1 Oct. 30, 2003

(30) Foreign Application Priority Data

Apr. 30, 2002 (JP) ............................................ 2002-128247

(51) Int. Cl.[7] ................................................ H03L 7/06
(52) U.S. Cl. .......................... 327/158; 327/159; 375/376
(58) Field of Search ................................ 327/153, 155, 327/161–163, 261, 158–160, 2–3, 5, 7; 375/373–376; 331/DIG. 2, 1 A

(56) References Cited

U.S. PATENT DOCUMENTS

| | | | | |
|---|---|---|---|---|
| 5,223,755 A | * | 6/1993 | Richley | 327/158 |
| 5,663,665 A | * | 9/1997 | Wang et al. | 327/3 |
| 5,744,991 A | * | 4/1998 | Jefferson et al. | 327/158 |
| 5,994,934 A | * | 11/1999 | Yoshimura et al. | 327/158 |
| 6,285,225 B1 | * | 9/2001 | Chu et al. | 327/158 |
| 6,549,041 B2 | * | 4/2003 | Waldrop | 327/5 |
| 6,628,154 B2 | * | 9/2003 | Fiscus | 327/158 |

FOREIGN PATENT DOCUMENTS

| | | |
|---|---|---|
| JP | 64-061139 | 3/1989 |
| JP | 9-139730 | 5/1997 |
| JP | 2001-203676 | 7/2001 |

* cited by examiner

*Primary Examiner*—Minh Nguyen
(74) *Attorney, Agent, or Firm*—Katten Muchin Zavis Rosenman

(57) ABSTRACT

A DLL circuit includes: an output dummy circuit having a prescribed propagation delay; a first delay element delaying a reference clock in accordance with a control signal and supplying the delayed signal to the output dummy circuit; a phase determination circuit comparing the phases of the reference clock and a feedback signal and supplying a control signal altering the delay amount of the first delay element; a second delay element receiving either the reference clock or the feedback signal, to serve as the trigger of the phase comparison operation, and delaying this signal by a delay amount; and a latch circuit latching the other signal not serving as the trigger of the phase comparison operation in synchronization with the rising edge of the output signal of the second delay element and supplying a signal turning on or off the input of the other signal to the phase determination circuit.

4 Claims, 8 Drawing Sheets

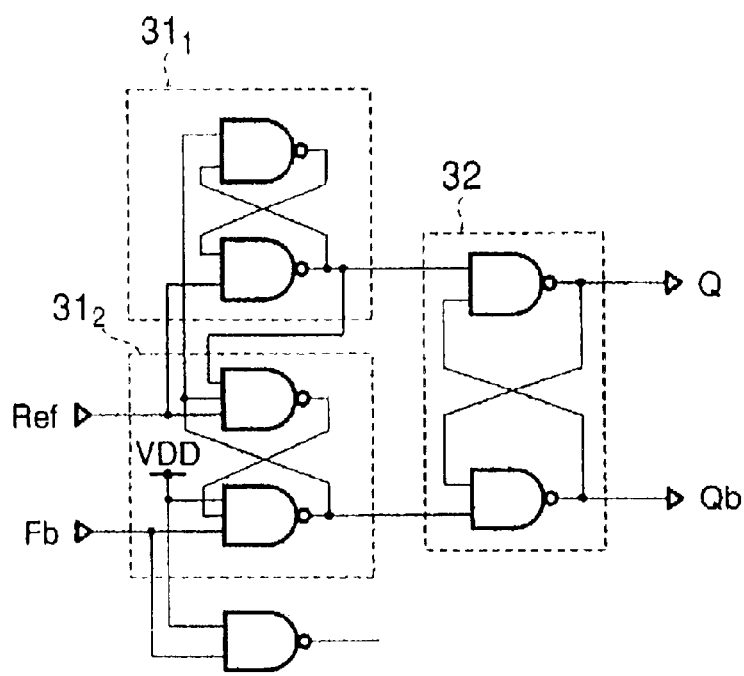
FIG. 2 (PRIOR ART)
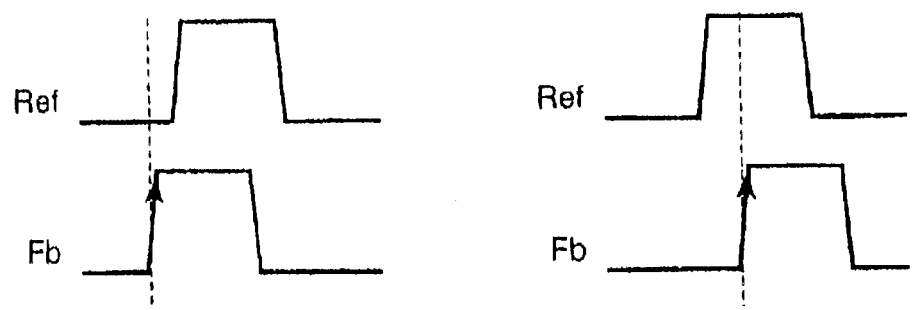
FIG. 3A
(PRIOR ART)
FIG. 3B
(PRIOR ART)

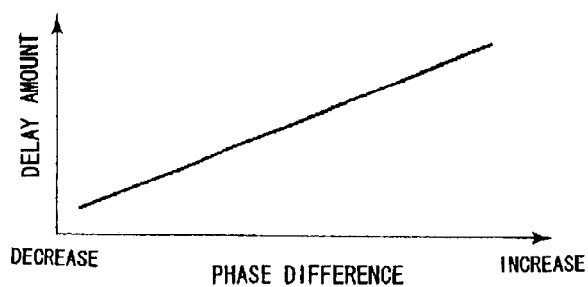
FIG. 7A
(PRIOR ART)
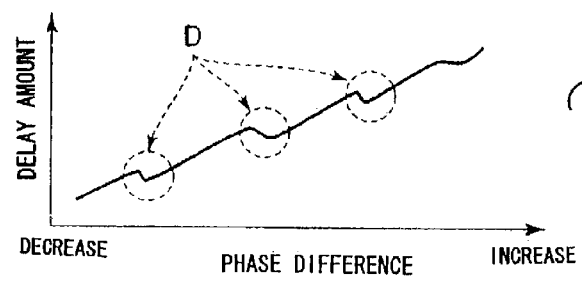
FIG. 7B
(PRIOR ART)
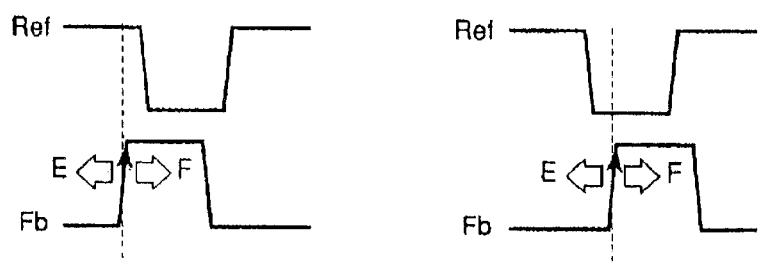
FIG. 8A
(PRIOR ART)
FIG. 8B
(PRIOR ART)

DLL CIRCUIT CAPABLE OF PREVENTING LOCKING IN AN ANTIPHASE STATE

BACKGROUND OF THE INVENTION

1. Field of the Invention

The present invention relates to a DLL (Delay-Locked Loop) circuit, which is a phase-locked circuit.

2. Description of the Related Art

As a result of the advances in the acceleration of processing speeds in systems that use semiconductor integrated circuit devices in recent years, memory devices have come into use such as DRAM (Dynamic Random Access Memory) and SDRAM (Synchronous DRAM) that operate at clocks of several hundred MHz. In addition, the power supply voltage has also been decreased to meet the demand for lower power consumption, and semiconductor integrated circuit devices that operate at voltages as low as 1.5 V have come into use.

In order to prevent increase in noise and malfunctioning of the system in systems such as these that operate at high speed and moreover at low voltage, it is important to suppress fluctuation in the characteristics of the output buffer circuit that is provided in the semiconductor integrated circuit device to cope with fluctuations in the power supply voltage and ambient temperature and variation in element characteristics.

In systems that include semiconductor integrated circuit devices such as DDR(Double Data Rate)-SDRAM that operate at high speed, DLL circuits, which are phase-locked circuits, are typically used to match the timing of data output of output buffer circuits that are provided in the semiconductor integrated circuit devices to the system clock. A DLL circuit is a circuit that uses an output dummy circuit having a propagation delay that is similar to the output buffer circuit to monitor the amount of delay of the output buffer circuit from the system clock, generates an internal clock for compensating the amount of delay from the system clock, and supplies the generated internal clock to the output buffer circuit, thereby synchronizing the timing of the data output of the output buffer circuit to the system clock.

We now refer to FIG. 1, which is a block diagram showing the construction of a DLL circuit of the prior art. As shown in FIG. 1, the DLL circuit of the prior art is a construction that includes:

output dummy circuit 1 having a propagation delay that is similar to that of an output buffer circuit that is provided in a semiconductor integrated circuit device;

delay element 2 for delaying a system clock (reference clock Ref) that prescribes the operation timing of the semiconductor integrated circuit device, supplying the delayed clock to output dummy circuit 1, and supplying this delayed clock as internal clock CLK; and phase determination circuit 3 for comparing the phases of reference clock Ref and feedback signal Fb that is supplied as output from output dummy circuit 1 and supplying control signal Q for altering the amount of delay of delay element 2 based on the comparison result.

Phase determination circuit 3 compares the phases of reference clock Ref and feedback signal Fb that is supplied from output dummy circuit 1, supplies control signal Q for increasing the amount of delay of delay element 2 when the phase of feedback signal Fb is advanced from reference clock Ref, and supplies control signal Q for decreasing the amount of delay of delay element 2 when the phase of feedback signal Fb is retarded from reference clock Ref. By means of this operation, the DLL circuit operates such that the phase of feedback signal Fb that is supplied from output dummy circuit 1 matches the phases of reference clock Ref. Properly speaking, the operation of DLL circuit is controlled such that the phase of feedback signal Fb coincides with a time that is delayed one cycle from the phase of reference clock Ref.

When the phases of feedback signal Fb and reference clock Ref match, internal clock CLK is a signal having a phase that is advanced from that of feedback signal Fb by exactly the propagation delay of output dummy circuit 1, and that is also advanced from the phase of reference clock Ref by exactly the propagation delay of output dummy circuit 1. Using internal clock CLK to operate the output buffer circuit therefore causes data signals to be supplied as output from the output buffer circuit with the same phase as reference clock Ref.

We next refer to FIG. 2, which is a circuit diagram showing an example of the construction of the phase determination circuit shown in FIG. 1, and FIGS. 3A and 3B, which are timing charts showing the operation of the phase determination circuit shown in FIG. 1.

As shown in FIG. 2, phase determination circuit 3 is a construction that includes: two first flip-flops $31_1$ and $31_2$ to which reference clock Ref is applied as input; and second flip-flop 32 to which the output of first flip-flops 311 and 312 is applied as input and that generates control signal Q (phase determination result) and the inverted signal Qb of this control signal Q for controlling the amount of delay of the above-described delay element 2. First flip-flops $31_1$ and $31_2$ and second flip-flop 32 are each made up from two NAND gates, the output of each NAND gate of a pair being fed back as input to the other NAND gate. Power supply voltage VDD and feedback signal Fb are applied as input to one of the NAND gates of first flip-flop 312. The input capacitance of each NAND gate to which reference clock Ref and feedback signal Fb are applied is set to substantially the same value.

In a construction of this type, when reference clock Ref and feedback signal Fb are both "LOW" and feedback signal Fb becomes "HIGH" before reference clock Ref, as shown in FIG. 3A, a "LOW" signal is supplied as control signal Q. On the other hand, when reference clock Ref and feedback signal Fb are both "LOW" and reference clock Ref becomes "HIGH" before feedback signal Fb as shown in FIG. 3B, a "HIGH" signal is supplied as control signal Q. The delay amount of delay element 2 is controlled based on these phase determination results. FIGS. 3A and 3B show a case in which the phases of reference clock Ref and feedback signal Fb are compared with the rising edge of feedback signal Fb as the standard, but the phases may be compared with the rising edge of reference clock Ref as standard, or the phase comparison may be realized with the falling edge of either reference clock Ref or feedback signal Fb as the standard.

We next refer to FIG. 4, which is a circuit diagram showing an example of the construction of the delay element that is shown in FIG. 1. In addition, FIG. 5 is a circuit diagram showing an example of the construction of the delay chain circuit that is shown in FIG. 4, and FIG. 6 is a circuit diagram showing an example of the construction of the CLK mix circuit that is shown in FIG. 4. FIG. 4 is a construction typically referred to as a digital delay element.

As shown in FIG. 4, delay element 2 is a construction that includes: delay chain circuit 21 for supplying signals in which reference clock Ref has been delayed in steps at relatively large time intervals; and delay amount interpolation circuit 22 for interpolating the delay amount of each step that is supplied from delay chain circuit 21.

As shown in FIG. 5, delay chain circuit 21 is a construction that is provided with: a plurality of inverter circuits connected in a series, and output ports (1, 2, 3, ..., N, N+1, N+2, ..., Nmax; where N is a positive integer), one output port being provided for each two inverter circuits. In a construction of this type, reference clock Ref is delayed by each of the inverter circuits, and, reference clock Ref is supplied as output from each output port, the amount of delay of this reference clock Ref depending on the number of inverter circuits that are inserted between that output port and the input port of reference clock Ref. In this case, the amount of delay realized by two inverter circuits (the difference in delay amount between adjacent output ports) is on the order of 400 ps. Delay element 2 that is shown in FIG. 4 is a construction that selects the output signals (M and M+1, where M is a positive integer) of two consecutive output ports of the output ports of delay chain circuit 21 and interpolates the amount of delay between these output signals by means of delay amount interpolation circuit 22.

As shown in FIG. 4, delay amount interpolation circuit 22 is a construction that includes:

CLK selection circuit 23 for selecting, in accordance with control signal Q, the output signals (M and M+1) of two output ports of the output ports of delay chain circuit 21 having consecutive delay amounts;

antiphase CLK generation circuit 24 for supplying as output the output signals (M and M+1) of CLK selection circuit 23 and the inverted signals of these signals (Mb and (M+1)b);

CLK mix circuit 25 that is supplied with the output signals of antiphase CLK generation circuit 24 for interpolating the delay amounts of the two output signals (M and M+1) that have been selected by CLK selection circuit 23;

bias circuit 26 for generating bias voltages for altering the delay amounts produced by CLK mix circuit 25 in accordance with control signal Q; and CMOS circuit 27 for converting the output signal of CLK mix circuit 25 to CMOS voltage levels.

As shown in FIG. 6, CLK mix circuit 25 is a construction that includes:

transistor Tr1 that receives output signal (M) of CLK selection circuit 23;

transistor Tr2 that receives antiphase clock (Mb) that is supplied from antiphase CLK generation circuit 24 and that has its source connected in common with the source of transistor Tr1;

transistor Tr3 that receives output signal (M+1) of CLK selection circuit 23;

transistor Tr4 that receives antiphase clock (M+1)b that is supplied from antiphase CLK generation circuit 24 and that has its source connected in common with the source of transistor Tr3;

first current-source transistor Tr5 for causing a prescribed current to flow to transistors Tr1 and Tr2; and second current-source transistor Tr6 for causing a prescribed current to flow to transistors Tr3 and Tr4.

The drains of transistors Tr1 and Tr3 are connected in common and are supplied with power supply voltage VDD by way of resistor R1. Similarly, the drains of transistors Tr2 and Tr4 are connected in common and supplied with power supply voltage VDD by way of resistor R2. Transistors Tr1 and Tr2 make up one differential circuit, and transistors Tr3 and Tr4 make up another differential circuit. Output signal OUTb is supplied from the drains of transistors Tr1 and Tr3, and output signal OUT is supplied from the drains of transistors Tr2 and Tr4.

CLK mix circuit 25 that is shown in FIG. 6 is a construction that uses two differential circuits to mix output signals (M)/antiphase clock (Mb) and output signals (M+1)/antiphase clock (M+1) in order to generate output signals OUT/OUTb having a desired delay amount. CLK mix circuit 25 changes the delay amount of output signals OUT/OUTb by altering the bias voltages that are supplied to first current-source transistor Tr5 and second current-source transistor Tr6. As an example, if Ia is the current that flows to first current-source transistor Tr5 and Ib is the current that flows to second current-source transistor Tr6, Ia+Ib is always fixed, and if the bias voltages are then varied to obtain Ia: Ib=10:0; then output signals OUT/OUTb will be a clock having a delay amount that is delayed from output signal (M)/antiphase clock (Mb) by just one differential circuit stage. If the bias voltage is varied to obtain Ia:Ib= 0:10, output signals OUT/OUTb will be a clock having a delay amount that is delayed from output signal (M+1)/ antiphase clock (M+1)b by one differential circuit stage. Further, if the bias currents are varied to obtain Ia:Ib=5:5, output signals OUT/OUTb will be a clock having a delay amount that is the midpoint of output signal (M)/antiphase clock (Mb) and output signal (M+1)/antiphase clock (M+1) b.

CLK selection circuit 23 is constructed from, for example, a DSP (Digital Signal Processor) that includes a multiplexer. CLK selection circuit 23 serves the purpose of selecting prescribed output signals of delay chain circuit 21 in accordance with control signal Q and antiphase determination signal R (to be described hereinbelow). In addition, bias circuit 26 is constructed from, for example, a DSP that includes a D (Digital)/A (Analog) conversion circuit and serves the purpose of supplying prescribed bias voltages in accordance with control signal Q.

A delay element that is included in the above-described DLL circuit of the prior art is provided with characteristics for increasing the delay amount at a prescribed inclination in accordance with the phase difference between feedback signal Fb and reference clock Ref, as shown in FIG. 7A. Operation of this type is similar to a construction in which the delay element is of the analog type.

In an actual delay element, however, fluctuations in the ground potential or factors relating to the circuit configuration may cause time intervals in which the delay amount decreases (or the delay amount remains unchanged) as the phase difference increases or in which the delay amount increases (or the delay amount remains unchanged) as the phase difference decreases, as shown by "D" in FIG. 7B.

This type of nonlinear characteristic is caused by, for example, increases in the ground potential that result from the flow of a large amount of current to the ground potential at the falling edge of internal clock CLK that is supplied to all output buffer circuits in a semiconductor integrated circuit device.

When the ground potential rises, the power supply potential that is supplied to delay chain circuit 21 decreases substantially, and the delay time of the inverter circuits that make up the delay chain circuit 21 increases. In addition, current Ia that flows to the first current-source transistor Tr5 in CLK mix circuit 25 and bias voltage BiasA that is applied to the gate of first current-source transistor Tr5 have the relation:

$$Ia \propto (BiasA)^2$$

and current Ib that flows to second current-source transistor Tr6 and the bias voltage BiasB that is applied to the gate of second current-source transistor Tr6 have the relation:

$$Ib \propto (BiasB)^2$$

As a result, fluctuations in the bias voltage due to rises in ground potential have a strong influence on output signals OUT/OUTb.

When phases are compared with the rising edge of feedback signal Fb as the standard, reference clock Ref is "HIGH" in the state shown in FIG. 8A, and the phase determination circuit therefore supplies a determination result for advancing feedback signal Fb (Direction E in FIG. 8A). However, when the characteristic of delay element is in an interval indicated by "D" in FIG. 7B, a reduction of control signal Q for advancing feedback signal Fb causes the delay amount to increase. This increase in the delay amount causes operation in the DLL circuit that retards feedback signal Fb (Direction F in FIG. 8A).

In the state shown in FIG. 8B, in contrast, reference clock Ref is "LOW", and the phase determination circuit therefore supplies a determination signal for retarding feedback signal Fb (Direction F in FIG. 8A). However, if the characteristic of the delay element is in an interval indicated by "D" in FIG. 7B, increasing control signal Q to retard feedback signal Fb instead causes a reduction of the delay amount, and the operation of the DLL circuit therefore advances feedback signal Fb (Direction E in FIG. 8B).

The problem therefore occurs that, when the characteristic of the delay element is in an interval indicated by "D" in FIG. 7B, reference clock Ref and feedback signal Fb enter an antiphase state and cannot escape from this state (enter a locked state). In such a case, the data signals that are supplied as output from the output buffer circuit using internal clock CLK are shifted one-half cycle with respect to reference clock Ref and are therefore defective.

SUMMARY OF THE INVENTION

It is therefore an object of the present invention to provide a DLL circuit that is capable of preventing malfunctioning that causes locking in an antiphase state.

To achieve the above-described object, the DLL circuit of the present invention is a construction that includes:

an output dummy circuit having a prescribed propagation delay;

a first delay element for delaying a reference clock in accordance with a control signal from the outside and supplying this delayed signal to the output dummy circuit;

a phase determination circuit for comparing the phases of the reference clock and a feedback signal that is supplied as output from the output dummy circuit, and based on the result of this comparison, supplying the control signal for altering the delay amount of said first delay element;

a second delay element for receiving, of a reference clock and a feedback signal, the signal that serves as a trigger of a phase comparison operation, and for delaying this signal by a prescribed delay amount; and a latch circuit for latching the value of the other signal that does not serve as a trigger of the phase comparison operation in synchronization with the rising edge of the output signal of the second delay element and for supplying an enable signal for turning ON/OFF the input of the other signal to the phase determination circuit.

In a construction of this type, malfunctioning that causes locking of the DLL circuit during an antiphase state can be prevented because phase is not determined when the reference clock and feedback signal are in an antiphase state.

In addition, the DLL circuit of the present invention is a construction that includes:

an output dummy circuit having a prescribed propagation delay;

a first delay element for delaying a reference clock in accordance with a control signal from the outside and supplying this delayed signal to the output dummy circuit;

a phase determination circuit for comparing the phases of said reference clock and a feedback signal that is supplied from the output dummy circuit, and based on the result of this comparison, supplying the control signal for changing the delay amount of the first delay element;

a second delay element for receiving, of the reference clock and feedback signal, the signal that serves as the trigger for the phase comparison operation, and for delaying this signal by a prescribed delay amount;

a first latch circuit for latching the other signal that does not serve as the trigger of the phase comparison operation in synchronization with the rising edge of the output signal of the second delay element;

an inverter circuit for inverting the logic output of the first latch circuit; and a second latch circuit for, during intervals in which the output signal of the inverter circuit is a logic output that indicates that the reference clock and feedback signal are in the same phase, supplying the output of the phase determination circuit without alteration as the determination result; when the output signal of the inverter circuit becomes the other logic output that indicates that the reference clock and the feedback signal are in opposite phases, holding the value of the output signal of the phase determination circuit at that time; and, during intervals in which the output signal of the inverter circuit is this other logic output, maintaining and supplying the held value as the determination result.

In a construction of this type, the result of phase determination is not supplied to the delay element when the reference clock and feedback signal are in opposite phases, and malfunctioning in which the DLL circuit locks up during an antiphase state can therefore be prevented.

Further, the DLL circuit of the present invention is a construction that includes:

a first delay element for delaying a reference clock in accordance with a control signal from the outside and for supplying this delayed signal to the output dummy circuit;

a phase determination circuit for comparing the phases of the reference clock and a feedback signal that is supplied from the output dummy circuit, and based on the result of this comparison, supplying the control signal for changing the delay amount of the first delay element;

an XOR gate for supplying the EXCLUSIVE-OR of the reference clock and feedback signal; and a charging pump for, when the operation result of the XOR gate becomes a logic output that indicates that the reference clock and the feedback signal are in opposite phases, supplying an antiphase determination signal to the first delay element after the passage of a prescribed time interval, this antiphase determination signal being a signal for greatly changing the delay amount of the first delay element.

A construction of this type is capable of using the antiphase determination signal to release a locked state when the reference clock and the feedback signal are in the antiphase state, and thus can prevent malfunctioning in which the DLL circuit is locked in the antiphase state.

The above and other objects, features, and advantages of the present invention will become apparent from the following description with reference to the accompanying drawings, which illustrate examples of the present invention.

BRIEF DESCRIPTION OF THE DRAWINGS

FIG. 2 is a circuit diagram showing an example of the composition of the phase determination circuit shown in FIG. 1;

FIGS. 3A and 3B are timing charts showing the operation of the phase determination circuit that is shown in FIG. 1;

FIG. 7A is a graph showing the ideal characteristics of the delay element that is shown in FIG. 1;

FIG. 7B is a graph showing the actual characteristics of the delay element that is shown in FIG. 1;

FIGS. 8A and 8B are timing charts showing the operation of a DLL circuit that includes a delay element having the characteristics shown in FIG. 7B;

DETAILED DESCRIPTION OF THE PREFERRED EMBODIMENTS

First Embodiment

Figure 9:
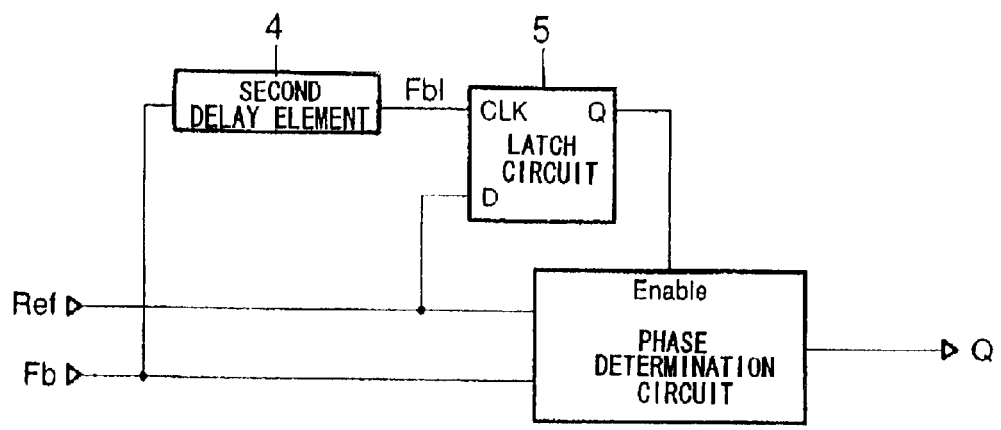
FIG. 9 is a block diagram showing the construction of the first embodiment of a DLL circuit of the present invention.
Figure 10:
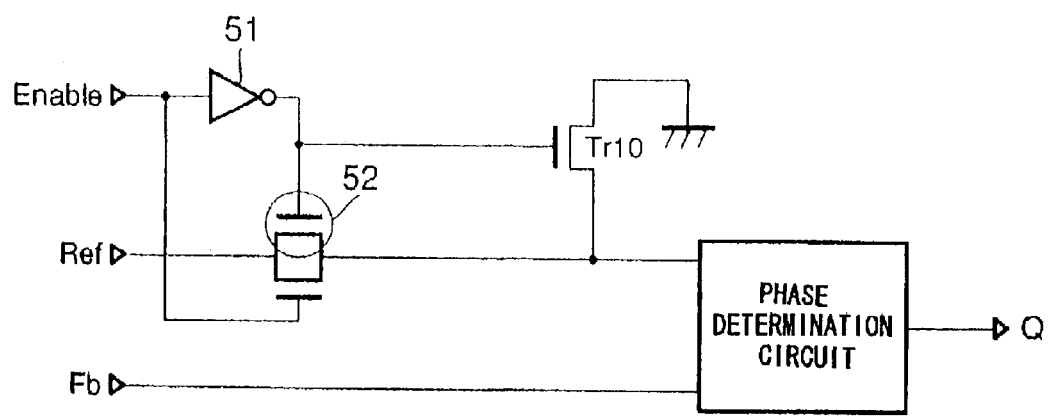
FIG. 10 is a circuit diagram showing an example of a construction for supplying an enable signal to the phase determination circuit that is shown in FIG. 9.
Figure 11A:
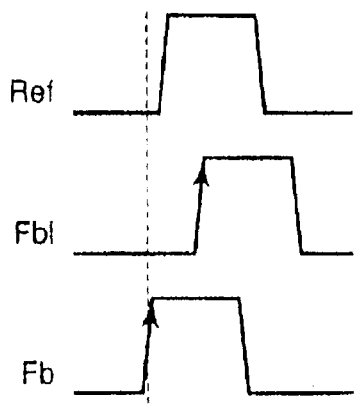
FIGS. 11A and 11B are timing charts showing the operation of the DLL circuit that is shown in FIG. 9.
Figure 11B:
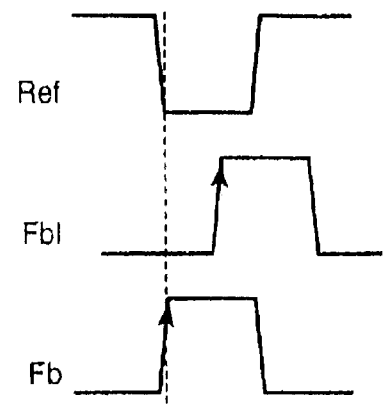

We next refer to FIG. 9, which is a block diagram showing the construction of the first embodiment of the DLL circuit of the present invention, and to FIG. 10, which is a circuit diagram showing an example of a construction for supplying an enable signal to the phase determination circuit that is shown in FIG. 9. In addition, FIGS. 11A and 11B are timing charts that show the operation of the DLL circuit that is shown in FIG. 9.

Figure 1:
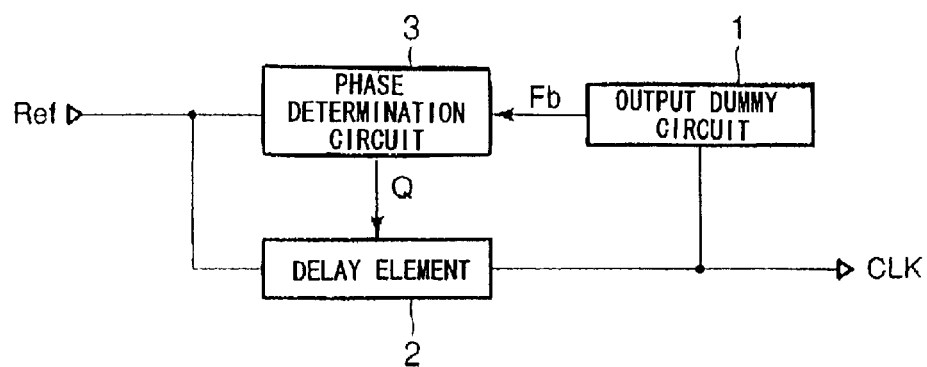
FIG. 1 is a block diagram showing the construction of a DLL circuit of the prior art.

As shown in FIG. 9, the DLL circuit of the present embodiment is a construction in which second delay element 4 and latch circuit 5 have been added to the DLL circuit of the prior art that was shown in FIG. 1.

A signal that serves as the trigger of a phase comparison operation (feedback signal Fb being taken as the trigger in the construction that is shown in FIG. 9) is applied as input to second delay element 4. Unlike the delay element that was shown in FIG. 1, second delay element 4 may employ an element having a fixed delay amount.

Latch circuit 5 takes signal Fb1, which is obtained by delaying feedback signal Fb, as clock input; and latches the value of reference clock Ref in synchronization with the rising edge of signal Fb1. The output of latch circuit 5 is used as the enable signal of the phase determination circuit. When a construction such as shown in FIG. 2 that lacks an enable input is used as the phase determination circuit, a control circuit such as the circuit shown in FIG. 10 may be added and the output signal (Enable) of latch circuit 5 may then be used to realize ON/OFF control of the input of the reference clock Ref to the phase determination circuit.

The control circuit that is shown in FIG. 10 is a construction that includes:

inverter circuit 51 for inverting the enable signal, transfer gate 52 for allowing or disallowing the passage of reference clock Ref in accordance with the output signal of inverter circuit 51; and transistor Tr10 for connecting the reference clock Ref input terminal, which is provided in the phase determination circuit, to the ground potential when reference clock Ref is not being supplied to the phase determination circuit.

In the DLL circuit of the present embodiment that is shown in FIG. 9, when reference clock Ref and feedback signal Fb are in substantially the same phase, for example, as shown in FIG. 11A, latch circuit 5 latches reference clock Ref in synchronization with the rising edge of signal Fb1, and a "HIGH" signal is therefore supplied as output from latch circuit 5. In this state, a phase comparison is carried out and the determination results are fed back to the delay element.

On the other hand, when reference clock Ref and feedback signal Fb are in substantially opposite phases as shown in FIG. 11B, latch circuit 5 latches reference clock Ref in synchronization with the rising edge of signal Fb1 and "LOW" signal is supplied as output from latch circuit 5. In this state, the phase determination circuit does not carry out phase determination but holds the value of the determination result that is supplied to the delay element until "HIGH" signal is supplied as output from the latch circuit.

According to this construction of the present embodiment, phase determination is not carried out when reference clock Ref and feedback signal Fb are in an antiphase state, and malfunctioning in which the DLL circuit locks up in the antiphase state can therefore be prevented.

Second Embodiment

Figure 12:
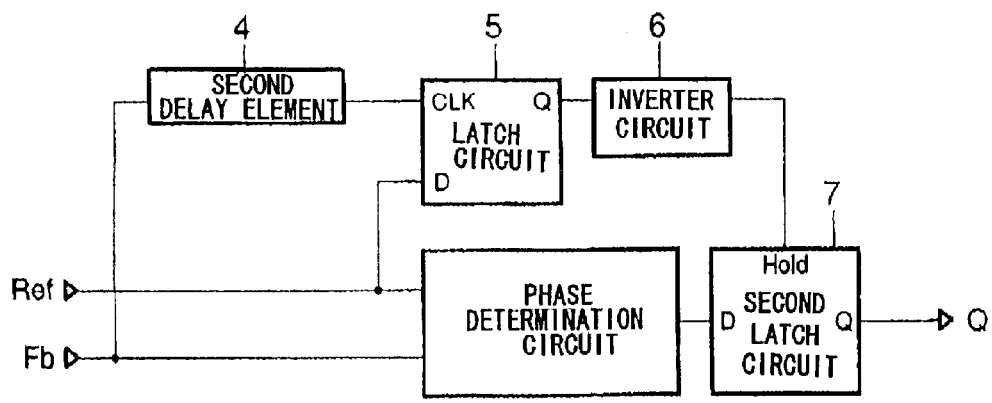
FIG. 12 is a block diagram showing the construction of the second embodiment of the DLL circuit of the present invention.

We next refer to FIG. 12, which is a block diagram showing the construction of the second embodiment of the DLL circuit of the present invention.

As shown in FIG. 12, the DLL circuit of the present embodiment is a construction in which inverter circuit 6 and second latch circuit 7 have been added to the construction of the first embodiment that is shown in FIG. 9.

Inverter circuit 6 inverts the logic output of latch circuit 5 (hereinbelow identified as the first latch circuit) that was shown in the first embodiment and supplies the result as a HOLD signal to second latch circuit 7.

Second latch circuit 7 takes the output of the phase determination circuit as data input, and supplies the output of the phase determination circuit without alteration as the determination result during intervals in which the HOLD signal is "LOW". When the HOLD signal turns to "HIGH", second latch circuit 7 holds the value of the output signal of the phase determination circuit at that time and maintains this value of the output signal as the determination result while the HOLD signal remains "HIGH".

In the DLL circuit of the second embodiment that is shown in FIG. 12, when reference clock Ref and feedback signal Fb are in substantially the same phase, for example as shown in FIG. 11A, the output of the first latch circuit becomes "HIGH" and the output of inverter circuit 6 becomes "LOW". Accordingly, the HOLD signal of second latch circuit 7 becomes "LOW" and the output of the phase determination circuit is therefore supplied without alteration as determination result Q.

On the other hand, when reference clock Ref and feedback signal Fb are in substantially opposite phases as shown in FIG. 11B, the output of the first latch circuit becomes "LOW" and the output of inverter circuit 6 becomes "HIGH". Second latch circuit 7 therefore holds the output value of the phase determination circuit at the time when the HOLD signal became "HIGH" and maintains this output value during the interval in which the HOLD signal is "HIGH".

Thus, according to the construction of the present embodiment, a phase determination result is not supplied as output to the delay element when reference clock Ref and feedback signal Fb are in an antiphase state, and malfunctioning in which the DLL circuit locks up during an antiphase state is therefore prevented.

In addition, when reference clock Ref and feedback signal Fb are determined to be in an antiphase state based on the output of the first latch circuit, increasing the amount of change of the delay amount of the delay element can hasten the locking time of the DLL circuit. This process can be realized by greatly changing the output signal of the delay chain circuit that is selected by CLK selection circuit that was shown in FIG. 4.

Third Embodiment

Figure 13:
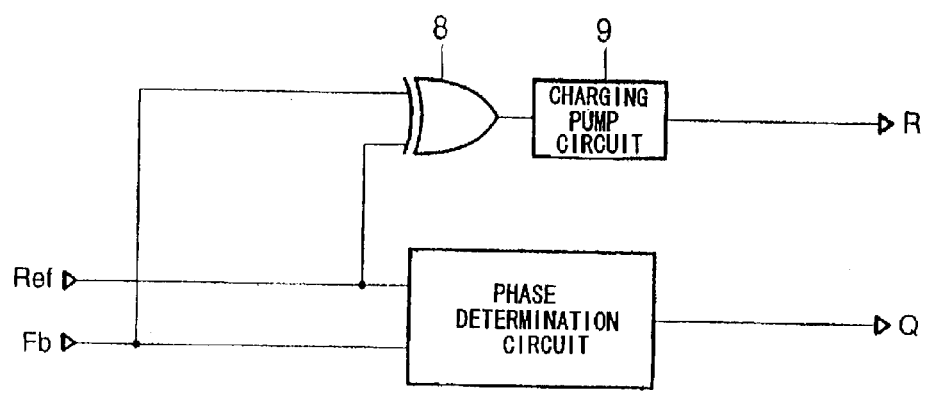
FIG. 13 is a block diagram showing the construction of the third embodiment of the DLL circuit of the present invention.

We next refer to FIG. 13, which is a block diagram showing the construction of the third embodiment of the DLL circuit of the present invention.

As shown in FIG. 13, the DLL circuit of this embodiment is a construction that includes:
a phase determination circuit of the same composition as the prior art;
XOR gate 8 for supplying the EXCLUSIVE-OR of reference clock Ref and feedback signal Fb; and
charging pump circuit 9.

Charging pump circuit 9 is a construction that is realized by, for example, an integrating circuit that includes a resistor and a capacitor, that receives the operation results of XOR gate 8, that accumulates the electric charge by means of a capacitor when the output of XOR gate 8 is "HIGH" signal, and that discharges the electric charge that has accumulated in the capacitor when the output of XOR gate 8 is "LOW" signal. In addition, when the potential of the capacitor exceeds a fixed level, "HIGH" signal is supplied as antiphase determination signal R.

According to the DLL circuit of the third embodiment that is shown in FIG. 13, when reference clock Ref and feedback signal Fb are in substantially the same phase as shown in, for example, FIG. 11A, the output of XOR gate 8 is "LOW" signal and electric charge is therefore not accumulated in the capacitor of charging pump circuit 9.

On the other hand, when reference clock Ref and feedback signal Fb are in substantially opposite phases as shown in FIG. 11B, the output of XOR gate 8 is "HIGH" signal and charge is therefore accumulated in the capacitor of charging pump circuit 9. When the locked state continues in the antiphase state that is shown in FIG. 11B, the potential of the capacitor of charging pump circuit 9 exceeds a fixed level, and antiphase determination signal R therefore becomes "HIGH".

Figure 4:
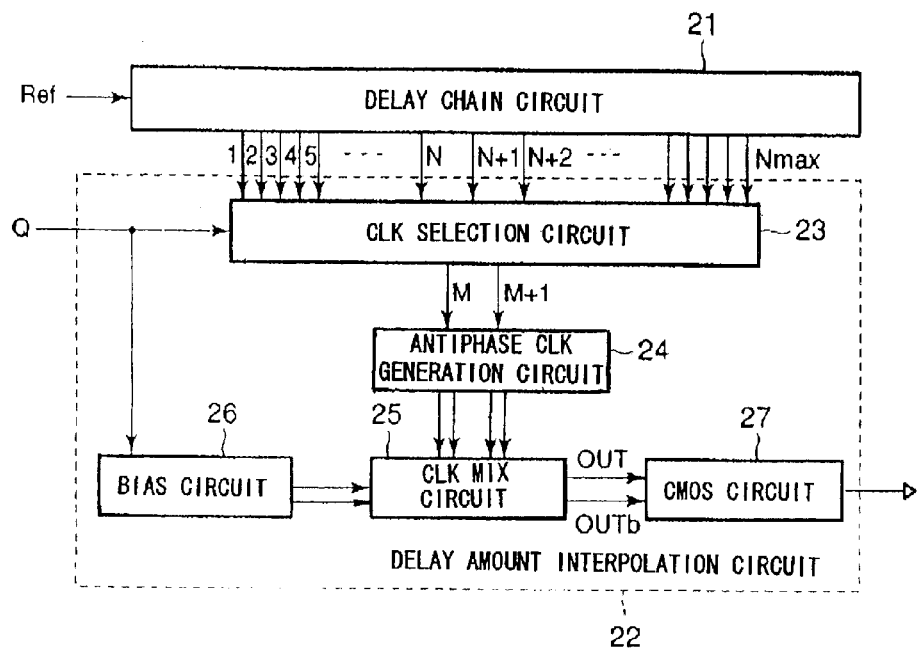
FIG. 4 is a circuit diagram showing an example of the composition of the delay element that is shown in FIG. 1.
Figure 5:
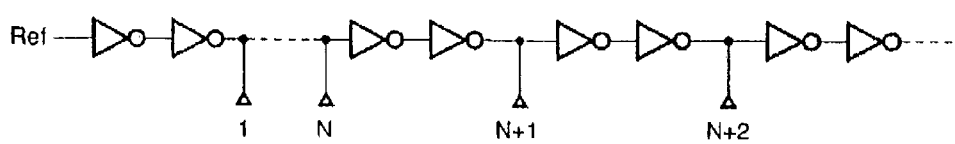
FIG. 5 is a circuit diagram showing an example of the composition of the delay chain circuit that is shown in FIG. 4.
Figure 6:
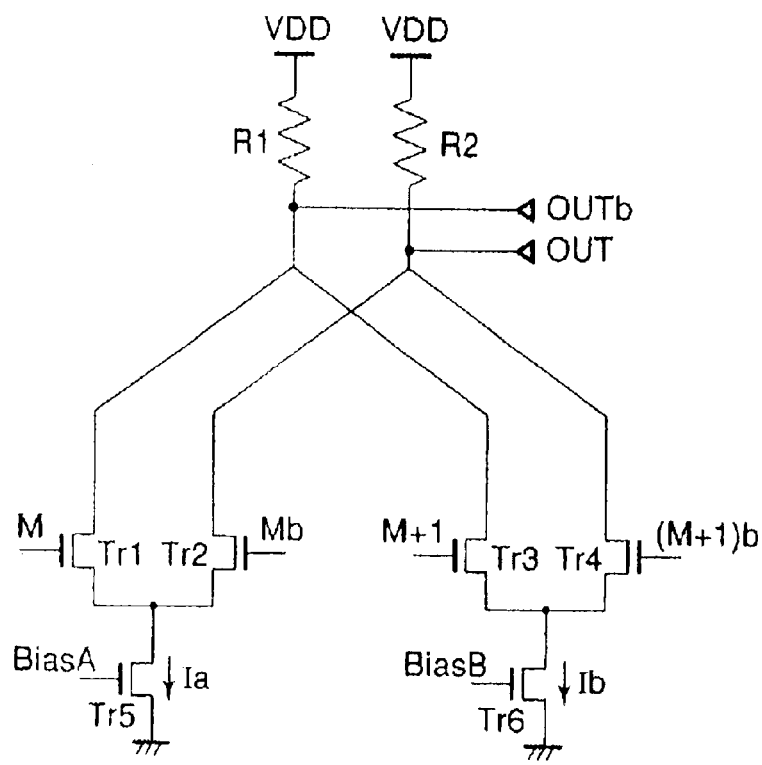
FIG. 6 is a circuit diagram showing an example of the composition of the CLK mix circuit that is shown in FIG. 4.

This antiphase determination signal R is received by, for example, the CLK selection circuit 23 of the delay element shown in FIG. 4, and the CLK selection circuit 23 causes a substantial change of the selected output signal of the delay chain circuit 21. The execution of this process releases locking in the antiphase state, following which the locking operation is again resumed.

The DLL circuit of the present embodiment is thus able to use antiphase determination signal R to release the locked state when reference clock Ref and feedback signal Fb are in an antiphase state, and therefore can prevent malfunctioning in which locking occurs in the DLL circuit in an antiphase state.

While preferred embodiments of the present invention have been described using specific terms, such description is for illustrative purposes only, and it is to be understood that changes and variations may be made without departing from the spirit or scope of the following claims.

What is claimed is:

1. A DLL circuit comprising:
an output dummy circuit having a prescribed propagation delay;
a first delay element for delaying a reference clock in accordance with a control signal and supplying a delayed signal to said output dummy circuit;
a phase determination circuit for comparing the phases of said reference clock and a feedback signal that is supplied as output from said output dummy circuit, and based on the result of this comparison, supplying said control signal for altering the delay amount of said first delay element;
a second delay element for receiving, one of said reference clock and said feedback signal, as a first signal that serves as a trigger of a phase comparison operation, and for delaying this signal by a prescribed delay amount; and
a latch circuit for latching the value of the other of said reference clock and feedback signal as a second signal that does not serve as a trigger of said phase comparison operation in synchronization with the rising edge of the output signal of said second delay element, and for supplying an enable signal for turning on or off the input of said first signal to said phase determination circuit.

2. The DLL circuit according to claim 1, further comprising:
an inverter circuit for inverting said enable signal;
a transfer gate for allowing passage or disallowing passage of said reference clock in accordance with the output of said inverter circuit; and
a transistor for connecting the input terminal of said reference clock that is provided in said phase determination circuit to the ground potential when said reference clock is not supplied to said phase determination circuit.

3. The DLL circuit according to claim 1, wherein said first delay element comprises:
- a delay chain circuit for supplying signals in which said reference clock is delayed in steps at relatively large time internals; and
- a delay amount interpolation circuit for interpolating delay amounts of each step that is supplied from said delay chain circuit.

4. The DLL circuit according to claim 3, wherein said delay amount interpolation circuit comprises:
- a CLK selection circuit for selecting, in accordance with said control signal, two output signals of two output ports of output ports said delay chain circuit having consecutive delay amounts;
- an antiphase CLK generation circuit for receiving the output signals of said CLK generation circuit and for supplying as output the output signals of said CLK selection circuit and inverted signals of the output signals of said CLK selection circuit;
- a CLK mix circuit for receiving the output of said antiphase CLK generation circuit and interpolating delay amounts indicated by said two output signals that have been selected at said CLK selection circuit; and
- a bias circuit rot generating bias voltages for changing delay amounts produced by said CLK mix circuit in accordance with said control signal.

* * * * *